United States Patent
Ambati et al.

(10) Patent No.: US 12,131,912 B2
(45) Date of Patent: Oct. 29, 2024

(54) ADVANCED ETCHING TECHNOLOGIES FOR STRAIGHT, TALL AND UNIFORM FINS ACROSS MULTIPLE FIN PITCH STRUCTURES

(71) Applicant: Intel Corporation, Santa Clara, CA (US)

(72) Inventors: Muralidhar S. Ambati, Hillsboro, OR (US); Ritesh Jhaveri, Hillsboro, OR (US); Moosung Kim, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 18/531,359

(22) Filed: Dec. 6, 2023

(65) Prior Publication Data

US 2024/0120206 A1    Apr. 11, 2024

Related U.S. Application Data

(60) Continuation of application No. 17/860,058, filed on Jul. 7, 2022, now Pat. No. 11,875,999, which is a
(Continued)

(51) Int. Cl.
*H01L 21/3065* (2006.01)
*H01L 21/308* (2006.01)
(Continued)

(52) U.S. Cl.
CPC ...... *H01L 21/3065* (2013.01); *H01L 21/3085* (2013.01); *H01L 21/3086* (2013.01);
(Continued)

(58) Field of Classification Search
CPC ............ H01L 21/3065; H01L 29/0657; H01L 29/0642; H01L 21/3085; H01L 21/324;
(Continued)

(56) References Cited

U.S. PATENT DOCUMENTS

| 5,614,060 A | 3/1997 | Hanawa |
| 6,387,798 B1 | 5/2002 | Loke |

(Continued)

FOREIGN PATENT DOCUMENTS

| KR | 10-2009-0125112 | 12/2009 |
| KR | 10-2013-0054107 | 5/2013 |

(Continued)

OTHER PUBLICATIONS

Office Action for Taiwan Patent App. No. 103140476, mailed Feb. 19, 2016, 10 pages.
(Continued)

*Primary Examiner* — Mouloucoulaye Inoussa
(74) *Attorney, Agent, or Firm* — Schwabe, Williamson & Wyatt P.C.

(57) ABSTRACT

Embodiments of the invention describe semiconductor devices with high aspect ratio fins and methods for forming such devices. According to an embodiment, the semiconductor device comprises one or more nested fins and one or more isolated fins. According to an embodiment, a patterned hard mask comprising one or more isolated features and one or more nested features is formed with a hard mask etching process. A first substrate etching process forms isolated and nested fins in the substrate by transferring the pattern of the nested and isolated features of the hard mask into the substrate to a first depth. A second etching process is used to etch through the substrate to a second depth. According to embodiments of the invention, the first etching process utilizes an etching chemistry comprising HBr, $O_2$ and $CF_4$, and the second etching process utilizes an etching chemistry comprising $Cl_2$, Ar, and $CH_4$.

20 Claims, 6 Drawing Sheets

Related U.S. Application Data continuation of application No. 17/164,230, filed on Feb. 1, 2021, now Pat. No. 11,417,531, which is a continuation of application No. 16/836,432, filed on Mar. 31, 2020, now Pat. No. 10,950,453, which is a continuation of application No. 16/234,460, filed on Dec. 27, 2018, now Pat. No. 10,643,855, which is a division of application No. 15/036,351, filed as application No. PCT/US2013/077626 on Dec. 23, 2013, now Pat. No. 10,204,794.

(51) Int. Cl.
*H01L 21/311* (2006.01)
*H01L 21/324* (2006.01)
*H01L 29/06* (2006.01)
*H01L 29/66* (2006.01)

(52) U.S. Cl.
CPC ...... *H01L 21/31116* (2013.01); *H01L 21/324* (2013.01); *H01L 29/0642* (2013.01); *H01L 29/0657* (2013.01); *H01L 29/66795* (2013.01)

(58) Field of Classification Search
CPC .......... H01L 29/66795; H01L 29/7853; H01L 29/7851; H01L 21/3086; H01L 29/772; H01L 29/785; H01L 21/76224; H01L 21/823431; H01L 21/823821; H01L 21/845; H01L 29/7848; H01L 21/31116; H01L 21/32139; H01L 27/0924; H01L 27/0886

See application file for complete search history.

(56) References Cited

U.S. PATENT DOCUMENTS

| | | | |
|---|---|---|---|
| 6,406,999 | B1 | 6/2002 | Esry |
| 6,909,147 | B2 | 6/2005 | Aller |
| 6,955,961 | B1 | 10/2005 | Chung |
| 8,501,607 | B1 | 8/2013 | Juengling |
| 8,513,131 | B2 | 8/2013 | Cai et al. |
| 8,975,129 | B1 | 3/2015 | Shieh |
| 10,204,794 | B2 | 2/2019 | Ambati |
| 2002/0151183 | A1 | 10/2002 | Yang |
| 2005/0237603 | A1 | 10/2005 | Sato |
| 2006/0211260 | A1 | 9/2006 | Tran |
| 2006/0219657 | A1 | 10/2006 | Morikita |
| 2006/0275988 | A1 | 12/2006 | Yagishita |
| 2007/0114612 | A1 | 5/2007 | Ahn |
| 2007/0221956 | A1 | 9/2007 | Inaba |
| 2008/0029821 | A1 | 2/2008 | Yamagami |
| 2008/0206900 | A1 | 8/2008 | Kim |
| 2008/0308848 | A1 | 12/2008 | Inaba |
| 2009/0014798 | A1 | 1/2009 | Zhu |
| 2009/0108354 | A1 | 4/2009 | Fujimoto |
| 2009/0206407 | A1 | 8/2009 | Anderson |
| 2009/0250740 | A1 | 10/2009 | Shinohe |
| 2010/0036518 | A1 | 2/2010 | Funk |
| 2010/0092891 | A1 | 4/2010 | Tran |
| 2010/0178770 | A1 | 7/2010 | Zin |
| 2010/0190345 | A1 | 7/2010 | Chen |
| 2010/0255612 | A1 | 10/2010 | Inoue |
| 2010/0291771 | A1 | 11/2010 | Zhou |
| 2011/0012201 | A1 | 1/2011 | Yagishita |
| 2011/0021029 | A1 | 1/2011 | Kamp |
| 2011/0042748 | A1 | 2/2011 | Anderson |
| 2011/0068405 | A1 | 3/2011 | Yuan |
| 2011/0068431 | A1 | 3/2011 | Knorr et al. |
| 2011/0097863 | A1 | 4/2011 | Shieh |
| 2011/0156148 | A1 | 6/2011 | Yu |
| 2011/0237081 | A1 | 9/2011 | Kewley |
| 2011/0260282 | A1 | 10/2011 | Kawasaki |
| 2011/0284960 | A1 | 11/2011 | Juengling |
| 2012/0094465 | A1 | 4/2012 | Anderson |
| 2013/0026572 | A1 | 1/2013 | Kawa |
| 2013/0134520 | A1 | 5/2013 | Maeda |
| 2013/0181297 | A1 | 7/2013 | Liaw |
| 2013/0221443 | A1 | 8/2013 | Lin |
| 2013/0224936 | A1 | 8/2013 | Lee |
| 2013/0236836 | A1 | 9/2013 | Sun |
| 2013/0244392 | A1 | 9/2013 | Oh |
| 2013/0270559 | A1 | 10/2013 | Hafez |
| 2013/0277720 | A1 | 10/2013 | Kim |
| 2013/0277759 | A1 | 10/2013 | Chen |
| 2013/0309838 | A1 | 11/2013 | XiuyuWei |
| 2013/0330889 | A1 | 12/2013 | Yin |
| 2014/0091434 | A1 | 4/2014 | Hopkins |
| 2014/0138800 | A1 | 5/2014 | He |
| 2014/0256093 | A1 | 9/2014 | Lin |
| 2014/0273538 | A1 | 9/2014 | Chen |
| 2014/0315371 | A1 | 10/2014 | Cai |
| 2014/0327074 | A1 | 11/2014 | Tsao |
| 2015/0027074 | A1 | 1/2015 | Preston |
| 2015/0028454 | A1 | 1/2015 | Cheng |
| 2015/0091057 | A1 | 4/2015 | Xie |
| 2015/0108616 | A1 | 4/2015 | Greene |
| 2015/0311199 | A1 | 10/2015 | Bouche |

FOREIGN PATENT DOCUMENTS

| | | |
|---|---|---|
| TW | 201351486 | 12/2013 |
| WO | WO 2008103454 | 8/2008 |

OTHER PUBLICATIONS

Extended European Search Report for European Patent Application No. 13900261.2 mailed Jul. 31, 2017, 12 pgs.

Altamirano-Sanchez E et al: "Dry etching fin process for SOI finFET manufacturing: Transition from 32 to 22nm node on a 6T-SRAM cell", Microelectronic Engineering, Elsevier Publishers BV., Amsterdam, NL, vol. 88, No. 9, Mar. 1, 2011 (Mar. 1, 2011), pp. 2871-2878, XP028257633, ISSN: 0167-9317, DOI :10.1016/J. MEE.2011.03.001.

Detter, X., et al., "Impact of chemistry on profile control of resist masked silicon gates etched in high density halogen-based plasmas", Journal of Vacuum Science & Technology B: Microelectronics Processing and Phenomena, American Vacuum Society, New York, NY, US, vol. 21, No. 5, Sep. 1, 2003 (Sep. 1, 2003), pp. 2174-2183, XP012010085, ISSN: 0734- 211X, DOI: 10.1116/1. 1612932.

Notice of Allowance—Taiwan Patent Application No. 103140476; dated Sep. 7, 2016, 2 pages.

International Preliminary Report on Patentability—PCT Application No. PCT/US2013/077626; dated Jul. 7, 2016, 7 pages.

International Search Report and Written Opinion for PCT/US2013/077626, dated Sep. 23, 2014, International Filing Date Dec. 23, 2013, 10 pages.

First Office Action for Chinese Patent Application No. 201380081115.1 mailed May 31, 2018, 12 pgs.

Office Action from Chinese Patent Application No. 201380081115.1, mailed Nov. 1, 2019, 8 pages.

Office Action from European Patent Application No. 13900261.2, mailed Dec. 4, 2019, 4pgs.

Office Action for Chinese Patent Application No. 201380081115.1 mailed Apr. 10, 2019, 7 pgs., no translation.

Office Action from Malaysia Patent Application No. PI2016701536, mailed Sep. 25, 2019, 3 pages.

Office Action from Korean Patent Application No. 10-2016-7013240, mailed Feb. 19, 2020, 12 pages.

Office Action from Chinese Patent Application No. 201380081115.1, mailed May 21, 2020, 7 pgs.

Office Action from Korean Patent Application No. 10-2016-7013240, mailed Oct. 27, 2020, 6 pages, with English translation.

Notice of Allowance from China Patent Application No. 201380081115.1, mailed Nov. 13, 2020, 4 pgs., with English translation.

Notice of Allowance from Korean Patent Application No. 10-2016-7013240, mailed Apr. 27, 2021, 2 pages.

(56) References Cited

OTHER PUBLICATIONS

Office Action from Korean Patent Application No. 10-2021-7020679, mailed Aug. 31, 2021, 8 pages.
European Search Report for European Patent Application No. 21178944.1 mailed Jul. Sep. 22, 2021, 14 pgs.
Choi Y K et al: "Spacer FinFET: nanoscale double-gate CMOS technology for the terabit era", Solid State Electronics, Elsevier Science Publishers, Barking, GB, vol. 46, No. 10, Oct. 1, 2002 (Oct. 1, 2002), pp. 1595-1601, XP027515156, ISSN: 0038-1101, DOI: 10.1016/S0038-1101(02)00111-9 [retrieved on Oct. 1, 2002].
Notice of Allowance from Malaysia Patent Application No. PI2016701536, mailed Nov. 15, 2021, 1 pages.
Notice of Allowance from Korean Patent Application No. 10-2021-7020679, mailed Nov. 16, 2021, 2 pages.
Office Action from Korean Patent Application No. 10-2022-7005398, mailed Apr. 29, 2022, 7 pages.
Notice of Allowance for European Patent Application No. 21178944.1 mailed Mar. 12, 2024, 9 pgs.
Notice of Allowance for European Patent Application No. 21178944.1 mailed Jul. 29, 2024, 40 pgs.

ADVANCED ETCHING TECHNOLOGIES FOR STRAIGHT, TALL AND UNIFORM FINS ACROSS MULTIPLE FIN PITCH STRUCTURES

CROSS-REFERENCE TO RELATED APPLICATION

This application is a Continuation of U.S. patent application Ser. No. 17/860,058, filed Jul. 7, 2022, which is a Continuation of U.S. patent application Ser. No. 17/164,230, filed Feb. 1, 2021, now U.S. Pat. No. 11,417,531, issued Aug. 16, 2022, which is a Continuation of U.S. patent application Ser. No. 16/836,432, filed Mar. 31, 2020, now U.S. Pat. No. 10,950,453, issued Mar. 16, 2021, which is a Continuation of U.S. patent application Ser. No. 16/234,460, filed Dec. 27, 2018, now U.S. Pat. No. 10,643,855, issued May 5, 2020, which is a Divisional of U.S. patent application Ser. No. 15/036,351, filed May 12, 2016, now U.S. Pat. No. 10,204,794, issued Feb. 12, 2019, which is a U.S. National Phase Application under 35 U.S.C. § 371 of International Application No. PCT/US2013/077626 filed Dec. 23, 2013, entitled "ADVANCED ETCHING TECHNIQUES FOR STRAIGHT, TALL AND UNIFORM FINS ACROSS MULTIPLE FIN PITCH STRUCTURES" which designates the United States of America, the entire disclosures of which are hereby incorporated by reference in their entirety and for all purposes.

FIELD OF THE INVENTION

Embodiments of the present invention relate generally to the manufacture of semiconductor devices. In particular, embodiments of the present invention relate to methods for forming high aspect ratio fin-based structures.

BACKGROUND AND RELATED ARTS

As microprocessors become faster and smaller, integrated circuitry (IC) becomes more complex and components become more densely packed. The use of non-planar fin based transistor devices has enabled increased performance with a smaller device footprint. Fins that are substantially rectangular in shape have improved short channel effects compared to fins with trapezoidal or triangular shapes. This leads to higher performance for a given voltage overdrive. Rectangular fins also enable consistent device performance across the fin height with no degradation in current.

However, as the aspect ratio of transistor devices continues to increase, the challenge of maintaining uniform widths and rectangular cross-sections of the fins across the substrate becomes more difficult. Specifically, when the critical dimension (CD) and pitch of the devices decrease, micro loading effects become a significant problem. Micro loading effects occur when the CD and pitch of the fins is small enough to create different active ion accessibility at the surface of the substrate during an etching process. This results in a structurally dependent etch bias due to localized enhanced etching or plasma deposition. Additionally, the micro loading effect becomes a more significant problem when the pitch between fin based structures is non-uniform. As an example, when nested fins and isolated fins are formed with a single etching process, the widths of the nested fins will not be equal to the widths of the isolated fins, because the micro loading effect will be different for each type of fin. Accordingly, it becomes increasingly difficult to design circuitry that includes fin based transistor devices that require non-uniform spacing. As a result of the different pitches, nested fins will have different metrics, such as leakage current and threshold voltage, than isolated fins, even though both fins are designed to perform equivalently.

DETAILED DESCRIPTION

Figure 1:
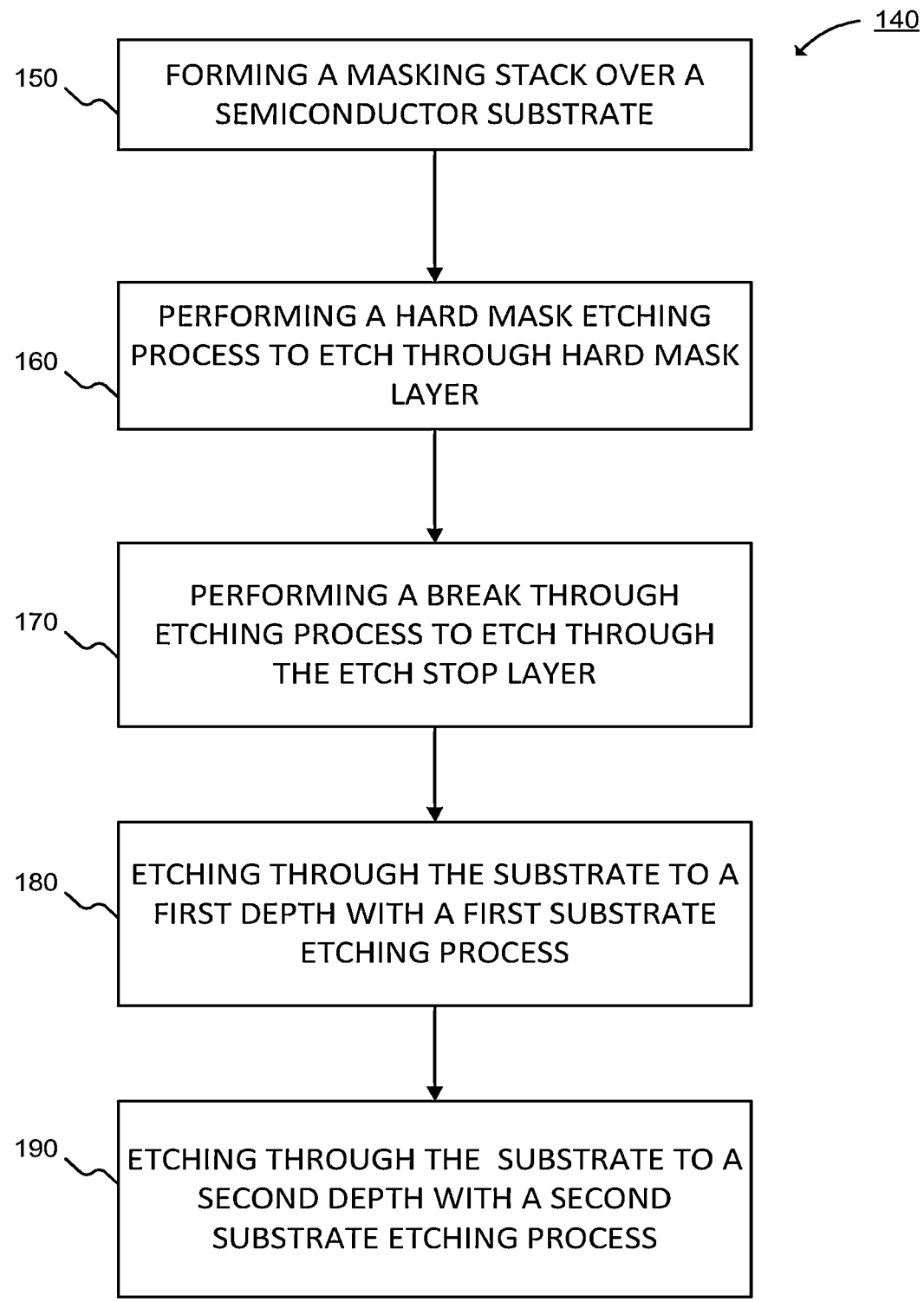
FIG. 1 illustrates a flow diagram of a method of forming high aspect ratio fin based semiconductor devices according to an embodiment of the invention.

Embodiments of the invention prevent micro loading effects from causing a significant difference in the widths of isolated fins and nested fins. Embodiments of the invention utilize multiple substrate etching processes to produce uniform fin widths with rectangular cross sections in both nested and isolated fin structures formed on the same substrate. Uniform fin width allows for the use of multi-fin devices that have uniform metrics, such as threshold voltage and leakage current, in the nested and isolated fin structures. Furthermore, uniform width in isolated and nested fins allows for the use of isolated fins in circuitry, such as an IC device.

Embodiments of the invention include a hard mask patterning process that transfers the fin shapes formed in a dummy hard mask into a hard mask layer. In order to maintain uniform fin widths between isolated and nested fins while transferring the shape of the fins into the hard mask, the hard mask etching process utilizes an etching chemistry with a high ratio of hydrogen to oxygen. According to an embodiment, the increased hydrogen concentration is obtained by utilizing an etching chemistry comprising CH3F. After the hard mask layer is patterned, embodiments of the invention utilize a breakthrough etch in order to remove portions of an etchstop layer above the substrate in which the fins will be formed.

Embodiments of the invention may also include multiple substrate etching processes in order to provide uniform fin width for the high aspect ratio fins. A first substrate etching process etches the substrate to a first depth. Embodiments of the invention include fin based devices with a first depth between 80 nm and 90 nm. Embodiments of the first etching process utilize a chemistry that passivates the sidewalls to preserve the fin width. By way of example, the first etching process may utilize a chemistry comprising HBr, O2 and CF4. In an embodiment, the first substrate etching process may have a lateral passivation rate that is greater for isolated fins than the lateral passivating rate for nested fins. As such, embodiments of the invention include a first substrate etching process that may result in the nested fins having a smaller width than the width of the isolated fins. Accordingly, embodiments of the invention may utilize a second etching process to equalize the widths of the isolated fins and the nested fins. The second etching process may equalize the widths of the fins by utilizing an etching chemistry that has a lateral etch rate that is greater for isolated fins than the lateral etch rate for nested fins. Embodiments of the invention utilize a chemistry comprising Cl2, Ar, and CH4 for the second substrate etching process. During the second etching process, the substrate is etched to a second depth. Embodiments of the invention may include a second depth that is between 120 nm and 160 nm.

According to embodiments of the invention, the aspect ratio of the fins is greater than 10:1. Furthermore, the high aspect ratio fins of certain embodiments of the present invention include fins that have a pitch of 42 nm and below and a CD of 15 nm and below. Additionally, embodiments include fin based devices that have one or more nested fins and one or more isolated fins.

FIG. 1 is a flow diagram that illustrates a method 140 of forming high aspect ratio fins with uniform widths according to an embodiment of the invention. Cross-sectional views of the fin based device 100 shown in FIGS. 2A-2D are used in conjunction with FIG. 1 to illustrate a method of forming uniform high aspect ratio fins according to an embodiment of the invention.

Figure 2A:
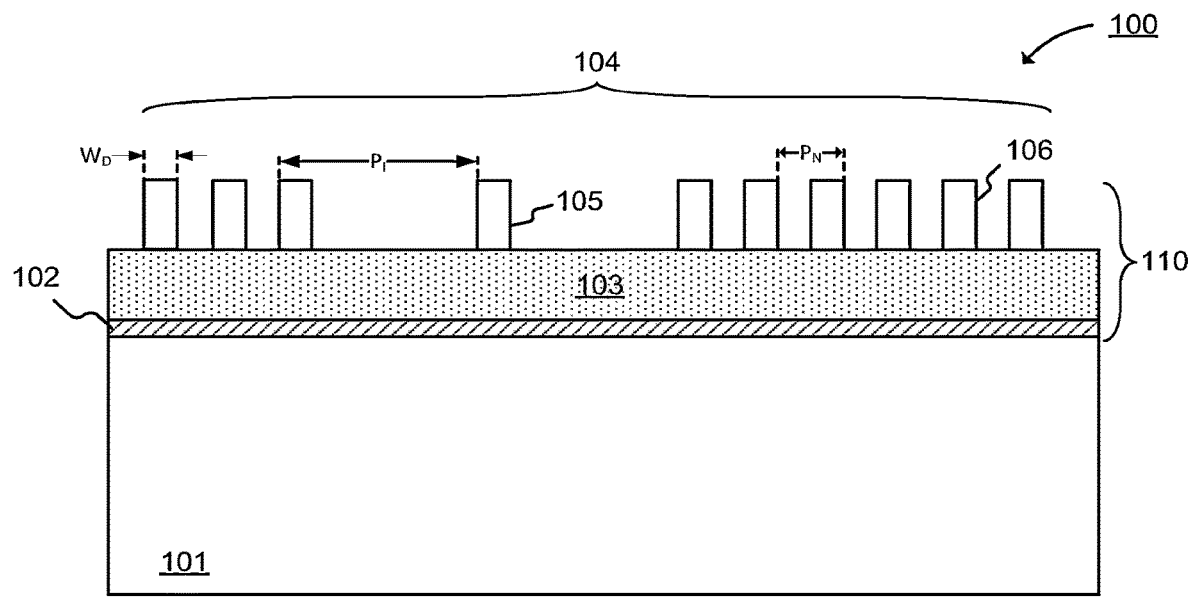
FIGS. 2A-2D illustrate cross-sectional views of a high aspect ratio fin based semiconductor device after different processes according to an embodiment of the invention.

Referring now to FIG. 1, the method of forming high aspect ratio fins 140 may begin at block 150 according to an embodiment. At block 150 a masking stack 110 is formed over a semiconductor substrate. FIG. 2A is a cross-sectional view of substrate 101 after a masking stack 110 has been disposed over its top surface. According to embodiments, the masking stack 110 may comprise a dummy hard mask 104, a hard mask layer 103, and an etchstop layer 102, as shown in FIG. 2A.

According to an embodiment, dummy hard mask 104 may include one or more isolated features 105 and one or more nested features 106. Isolated features 105 are disposed above portions of the substrate 101 where isolated fins 111I will be formed during subsequent processing, and nested features 106 are disposed above portions of the substrate 101 where nested fins 111N will be formed during subsequent processing. According to an embodiment, the dummy hard mask 104 may be composed of a typical masking material, such as an oxide. According to embodiments of the invention, the width WD of the isolated and nested features 105, 106 are chosen such that they are larger than the desired fin widths of the nested and isolated fins. Forming isolated and nested features 105, 106 with a width WD greater than the desired width of the fins 111 allows for subsequent etching processes to have a non-zero lateral etch rate that reduces the width of the fins. According to an embodiment of the invention, the width WD of the features 105, 106 are less than 20 nm. Embodiments of the invention may also include a dummy hard mask 104 with features 105, 106 that have a width WD less than 15 nm.

According to embodiments, a multiple patterning process may be used to form the dummy hard mask 104. A multiple patterning process may be desirable when the pitches PN and PI between features are sufficiently small, such that the resolution of lithography techniques are insufficient to pattern the dummy hard mask. Embodiments of the invention include a double patterning process in which spacers are formed on the sidewalls of pre-patterned features, as is known in the art. According to an embodiment, the spacers may be an oxide material and the pre-patterned features may be a polysilicon material. According to an embodiment, the pre-patterned features may be formed with a lithography process known in the art, such as photolithography. The spacers may be formed by disposing a layer of material, such as an oxide, over the pre-patterned features and the exposed surfaces of the hard mask layer 103. An anisotropic spacer etching process may then be used to remove the oxide material disposed on the horizontal surfaces of the exposed hard mask layer 103 and the pre-patterned features, leaving only spacers disposed on the sidewalls of the pre-patterned features. The pre-patterned features may be selectively removed, thereby leaving only the spacers behind. The pitch between each of the spacers may be adjusted by changing the width of the pre-patterned material. According to an embodiment, the remaining spacers may be used as the isolated features 105 and the nested features 106 that form the dummy hard mask 104. According to an additional embodiment, the double patterning process may be repeated one or more times, with the final remaining set of spacers being utilized as the isolated and nested features 105, 106 of the dummy hard mask 104.

According to an embodiment, the dummy hard mask 104 is formed from a material that is resistant to an etching process that will selectively etch through the hard mask layer 103 that is disposed below it, as shown in FIG. 2A. According to an embodiment, the dummy hard mask 104 may be an oxide material, such as silicon dioxide. In an embodiment, the hard mask layer 103 is a material that is resistant to an etchant that will selectively etch the substrate 101. According to an embodiment, the hard mask layer 103 is a nitride. Certain embodiments include a hard mask layer 103 that is a thermally grown nitride, such as Si3N4. Embodiments of the invention have a hard mask layer 103 that has a thickness between 40 nm and 60 nm. Additional embodiments of the invention include forming the hard mask layer 103 with processes such as, chemical vapor deposition (CVD), physical vapor deposition (PVD), or atomic layer deposition (ALD).

As shown in FIG. 2A, embodiments of the invention may include a hard mask layer 103 that is disposed above an etch stop layer 102. The etch stop layer may be a suitable oxide layer, such as a silicon dioxide layer. Embodiments of the invention may include a thermally grown oxide layer that is less than 10 nm thick. Additional embodiments have an etchstop layer 102 that is a silicon dioxide layer that is thermally grown and approximately 7 nm thick. Embodiments of the invention may also include forming the etch stop layer 102 with processes such as, CVD, PVD, or ALD.

According to an embodiment, the etch stop layer 102 is disposed on a top surface of the semiconductor substrate 101, as shown in FIG. 2A. According to an embodiment of the invention, semiconductor substrate 101 may be composed of a material suitable for semiconductor device fabrication, such as a monocrystalline silicon substrate or a SOI substrate.

Figure 2B:
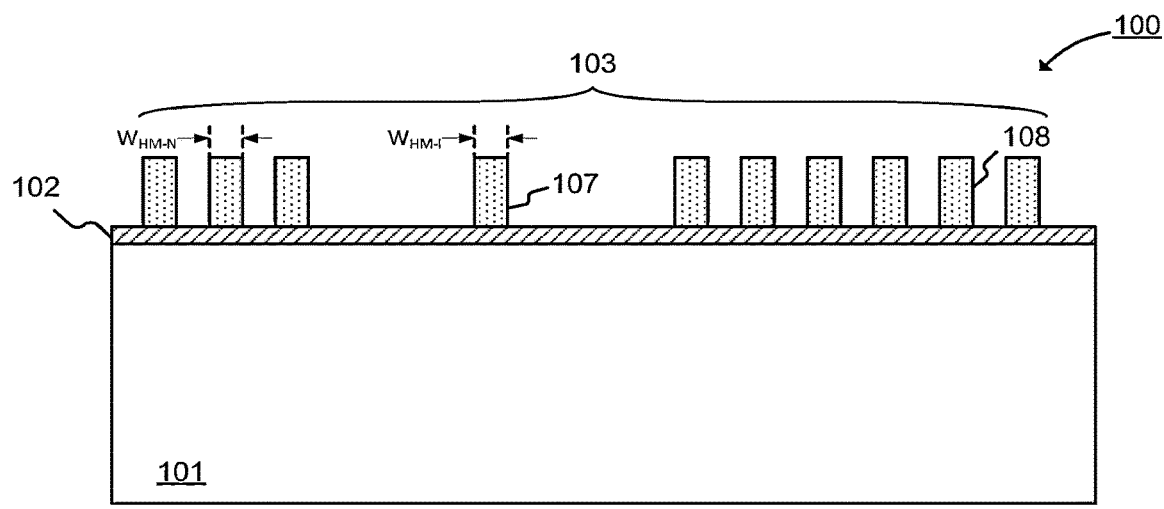

Referring back to FIG. 1, the method of forming high aspect ratio fins 140 proceeds to block 160. At block 160, a hard mask etching process is implemented to etch through the hard mask layer 103. According to an embodiment of the invention, the hard mask etching process utilizes the dummy hard mask 104 as a mask in order to transfer the isolated and nested features 105, 106 into the hard mask layer 103 to form isolated hard mask features 107 and nested hard mask features 108. Accordingly, the isolated hard mask features 107 and the nested hard mask features 108 are aligned with the isolated and nested dummy hard mask features 105 and 106, respectively. FIG. 2B is an illustration of the hard mask layer 103 after it has been patterned with a hard mask etching process in order to form the isolated hard mask features 107 and the nested hard mask features 108 according to an embodiment of the invention.

Due to the variability in the micro loading effects resulting from the non-uniform pitch, the hard mask etching process must be controlled to ensure that the lateral etching rate of the isolated features 107 and the nested features 108 are uniform. The lateral etching rate of the hard mask etching process is dependent on the passivation of the sidewalls and the rate at which the active species from the plasma can etch away the hard mask material. The variable pitch across the substrate 101 results in there being fins that are more accessible to the active species thereby causing these fins to etch faster. Additionally, the polymer deposition rate along the sidewalls of the fins is also dependent on pitch. Accordingly, without control of the polymer deposition, the width of the isolated features and nested features may be non-uniform as a result of different lateral etch rates.

In a fluorine based plasma, increases in the concentration of hydrogen in the plasma result in an increase in the rate of polymerization. Increased polymerization improves the passivation of the sidewalls of the hard mask fins that are formed during the hard mask etching process. The additional hydrogen present in the plasma scavenges fluorine from the plasma and results in a more carbon-rich plasma. The excess carbon in the plasma is able to form non-volatile molecules that passivate the surfaces and prevent etching. The passivation layer forms primarily on the sidewalls because the portions of the passivation layer that are disposed on horizontal surfaces are removed by ion bombardment. Accordingly, the increase in polymerization will increase the sidewall passivation and improve the anisotropic nature of the etching chemistry. The improvement in the anisotropic nature of the etching process improves the uniformity in the width of the isolated hard mask features WHM-I and the nested hard mask features WHM-N.

However, increases in the concentration of hydrogen in the plasma also results in a decrease in the etch selectivity of the hard mask layer 103 over the dummy hard mask 104 according to embodiments with a nitride hard mask layer 103 and an oxide dummy hard mask 104. Since the presence of excess hydrogen scavenges fluorine, the fluorine concentration drops. At lower concentrations of fluorine, the etch rates of the nitride hard mask 103 and the oxide dummy hard mask 104 become less selective to each other. Accordingly, oxygen can be added into the plasma to counteract this effect. When there is an increase in the oxygen content of the plasma, the oxygen scavenges carbon atoms to produce volatile CO and $CO_2$ which can be pumped out of the chamber. As such, the fluorine concentration of the plasma is increased and the additional reactive ions increase the etch rate of the nitride hard mask layer 103 greater than they increase the etch rate of the oxide dummy hard mask 104. Therefore, in order to transfer the pattern of the dummy hard mask 104 into the hard mask layer 103 without causing the micro loading effects to result in different widths of the isolated and nested features, a proper ratio of hydrogen to oxygen must be maintained within the plasma.

Under typical etching conditions, such as an etching chemistry that utilizes $CHF_3$ as the fluorine source, the micro loading effects generally cause the width of nested hard mask fins 108 to be smaller than the width of the isolated hard mask fins 107. Accordingly, the amount of passivation on the sidewalls of the nested hard mask fins is less than the amount of passivation on the sidewalls of the isolated hard mask fins. This problem may be overcome by providing an etching chemistry that increases the sidewall passivation. Therefore, embodiments of the invention utilizes an etching chemistry comprising a higher concentration of hydrogen than the concentration oxygen. Embodiments may utilize gases such as $CH_3F$ or $CH_2F_2$ in order to increase the hydrogen concentration of the plasma relative to etching chemistries that utilize $CHF_3$ as the fluorine source. As explained above, the increase in hydrogen causes fluorine to be scavenged from the plasma and allows for an increase in the carbon concentration. The increased carbon concentration increases the amount of passivation on the sidewalls.

However, it should be noted that if the hydrogen concentration is increased too much, then the opposite effect on the widths of features 107, 108 will be seen. In these instances, the nested features 108 will have a lower lateral etch rate than the lateral etch rate of the isolated features 107, because the passivation rate of the nested features will increase. This will result in thicker nested features 108 and thinner isolated features 107. Therefore, in order to balance the etching rates and produce uniform widths WHM-I and WHM-N, it is desirable to balance the increase in the hydrogen content by also incorporating oxygen into the plasma. According to embodiments of the invention, uniform widths WHM-I and WHM-N for isolated and nested features 107, 108 may be obtained when the ratio of hydrogen to oxygen (H:O) in the plasma is maintained between approximately 2.5:1 and 3.5:1. In order to achieve the hydrogen to oxygen ratios described by embodiments of the invention, a gas mixture including $O_2$, Ar, and $CH_3F$ may be used where the flow rate of the $O_2$ is between approximately 70 sccm and 100 sccm, the flow rate of the $CH_3F$ is between approximately 150 sccm and 200 sccm, and the flow rate of the Ar is between approximately 50 sccm and 150 sccm. Embodiments of the invention utilize a total pressure between 24 mTorr and 28 mTorr in the processing chamber during the hard mask etching process. Additional embodiments of the invention may utilize a total pressure of approximately 26 mTorr in the processing chamber during the hard mask etching process.

Embodiments also include utilizing different process gas flow rates across the surface of the substrate during processing. Embodiments include a process gas flow rate that is higher proximate to the center of the substrate relative to the flow rate proximate to the edge of the substrate. According to an embodiment of the invention, the ratio of the center gas flow rate to the edge gas flow rate is approximately 60%. By way of example, and not by way of limitation, if the $O_2$ flow rate is 100 sccm total, then the center $O_2$ flow rate may be 60 sccm and the edge $O_2$ flow rate may be 40 sccm.

Additional embodiments of the invention also control the widths WHM-I and WHM-N of the hard mask features 107, 108 by controlling the temperature of the chuck that supports the substrate during the hard mask etching process. Embodiments of the invention include maintaining the temperature of the chuck between 35° C. and 40° C. during the hard mask etching process. Additional embodiments include maintaining the temperature of the chuck at approximately 37° C. during the hard mask etching process.

Referring back to FIG. 1, the method of forming high aspect ratio fins 140 proceeds to block 170 where a break through etching process is performed according to embodiments of the invention. The break through etching process selectively removes portions of etch stop layer 102 between the hard mask features 107, 108 in order to expose the top surface of the semiconductor substrate 101. According to an embodiment of the invention, the break through etching process may include a chemistry comprising $CF_4$, $Cl_2$, and an Ar—$CH_4$ mixture. By way of example, and not by way of limitation, the $CF_4$ may have a flow rate of approximately 15 sccm, the $Cl_2$ may have a flow rate of approximately 65 sccm, and the Ar—$CH_4$ mixture may be approximately 4%

CH4 and have a flow rate of approximately 70 sccm. According to an embodiment, the total pressure during the break through etching process may be approximately 4.5 mTorr.

Figure 2C:
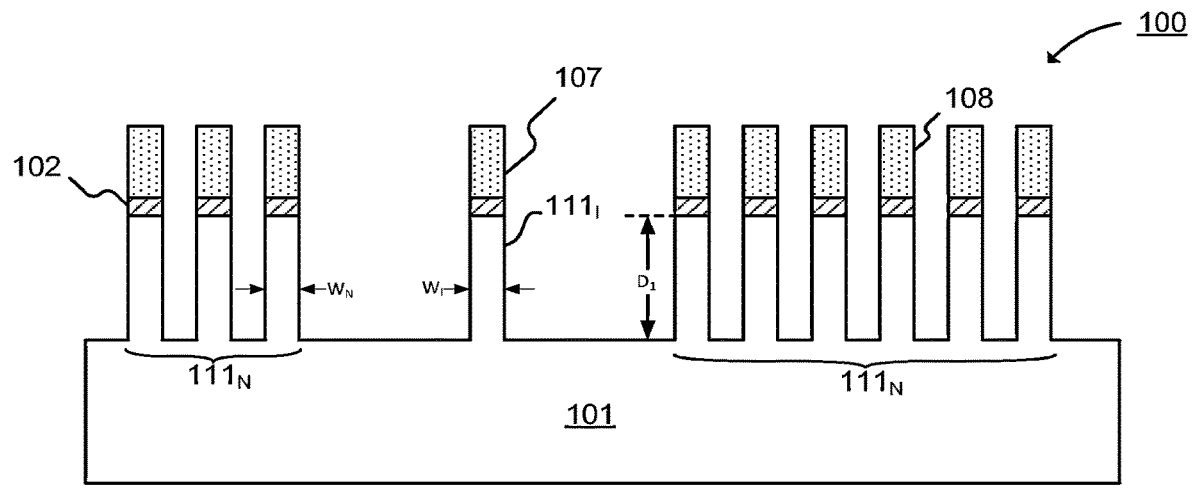

After the break through etching process has been performed the method of forming the high aspect ratio fins 140 proceeds to block 180 where a first substrate etching process is performed to etch into the substrate 101 to a first depth D1 according to an embodiment of the invention. As shown in FIG. 2C, the first depth D1 is measured from the top surface of the substrate 101 to the bottom of the trench between each of the fins 111. Embodiments of the invention include a first depth D1 that is between 70 nm and 100 nm. Embodiments of the invention also include a first depth D1 that is between 80 nm and 90 nm. According to an embodiment of the invention, the etching process is highly anisotropic and the widths of the isolated and nested fins WI and WN are substantially preserved. However, micro loading effects present due to the smaller pitch in the nested fins 111N may produce differences in the fin widths WN and WI between the nested fins 111N and the isolated fins 111I. Therefore, embodiments of the invention utilize an etching chemistry comprising HBr, O2 and CF4 to minimize this effect. According to an embodiment of the invention the HBr may have a flow rate of approximately 200 sccm, the O2 may have a flow rate of approximately 3.3 sccm, and the CF4 may have a flow rate of approximately 15 sccm. According to an embodiment of the invention the total pressure of during the first substrate etching process may be approximately 3.1 mTorr. The O2 functions as a passivating agent that improves the polymerization of the sidewalls. Even though the sidewalls are passivated by the O2, the sidewalls of the nested fins etch at a faster rate than the sidewalls of the isolated fins, because the lateral passivation rate is greater for isolated fins 111I than the lateral passivating rate for nested fins 111N. By way of example, and not by way of limitation, the isolated fins may be approximately 3 nm thicker after the first substrate etching process.

Figure 2D:
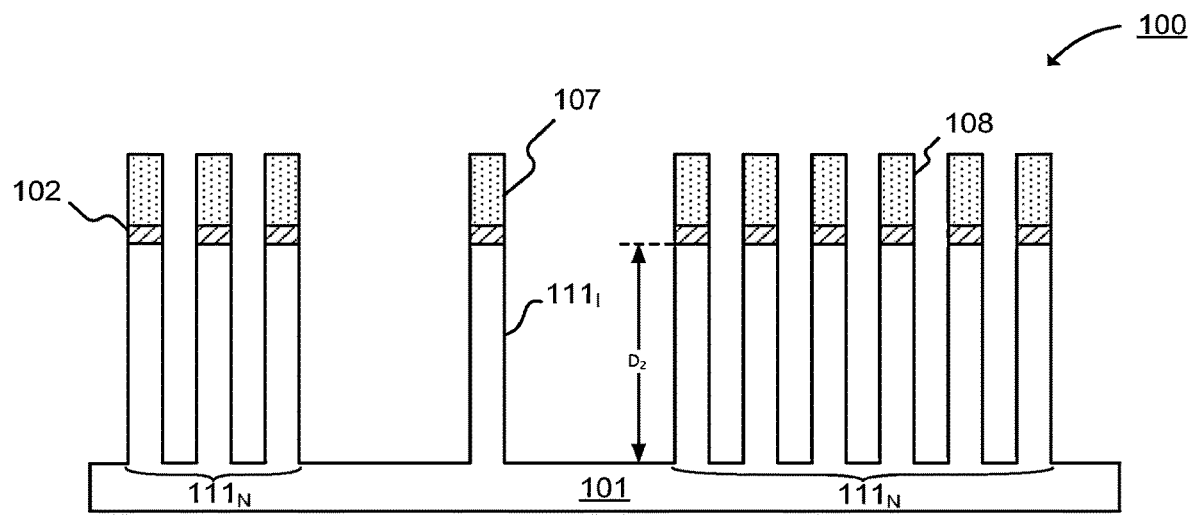

Referring back to FIG. 1, after the first depth D1 has been reached, the method for forming high aspect ratio fins 140 then proceeds to block 190 where a second substrate etching process is implemented according to an embodiment of the invention. According to an embodiment, the second substrate etching process etches through the substrate 101 to a second depth D2 from the top surface of the substrate, as shown in FIG. 2D. Embodiments of the invention include a second depth that is between 130 nm and 170 nm. Embodiments of the invention also include a second depth that is between 140 nm and 160 nm. In addition to providing the desired depth, the second substrate etching process also equalizes the widths WN, WI of the nested fins 111N and the isolated fins 111I. According to embodiments, the second substrate etching process equalizes the widths WN and WI by utilizing an etching chemistry that has a slower lateral etch rate for the nested fins 111N than the lateral etch rate for the isolated fins 111I. Embodiments of the invention utilize an etching chemistry comprising Cl2, Ar, and CH4. Embodiments of the invention utilize a process gas flow rate that provides a greater concentration of Cl2 compared to the concentration of the Ar and CH4 in order to ensure that the sidewalls of the nested fins 111N are etched at a slower rate than the sidewalls of the isolated fins 111I. The isolated fins 111I are more accessible to the chlorine species, and as such, they have a greater lateral etch rate. Embodiments of the invention utilize a flow rate of approximately 100 sccm for the Cl2 and approximately 28 sccm for the combination of Ar and CH4 in order to maintain the proper ratio of Cl2 to Ar/CH4. The total pressure of the processing chamber may be maintained between approximately 1 mTorr and 2 mTorr.

As noted above, the first substrate etching process may passivate the sidewalls of the isolated fins 111I faster than the sidewalls of the nested fins 111N, and the second etching process may etch the sidewalls of the isolated fins 111I faster than the sidewalls of the nested fins 111N. Accordingly, if the first depth D1 is chosen too shallow, then the fins may have an undercut, because the second substrate etching process will etch the sidewalls for a longer period before the second depth D2 is reached. Alternatively, if the first depth D1 is chosen to be too deep, then the fins may have a footing. The presence of a footing may result from there not being sufficient time to allow the fins 111 to have their sidewalls etched to the proper thickness before the second depth D2 is reached. Therefore, according to various embodiments, the first depth D1 is chosen to be between 70 nm and 100 nm in order to ensure that the fins 111 have widths WI and WN that are substantially equal to each other.

An additional embodiment of the invention further controls the uniformity of widths WI and WN of the high aspect ratio fins by controlling the RF power source of the plasma etching chamber during the first and second substrate etching processes. According to an embodiment, the RF power source is pulsed during the first and second substrate etching processes. Pulsing the RF power source allows for improved control of the desired anisotropic behavior of the etching processes. During the formation of high aspect ratio fins 111, the reactive etchant species may be quickly depleted at the bottom of the trenches between the fins 111. Pulsing the RF power source allows for more reactive etchant species to reach the bottom of the trench and prevents micro-trenching. The etchant species are drawn down into the trench when the RF power source is on. When the RF power source is off, the bi-products from the etching process are able to escape from the trench. Accordingly, reactant species at the bottom surface of the trench do not become depleted. According to an embodiment of the invention, the RF power is pulsed with a duty cycle that includes the RF power being on between 7-13% of the time and off for the remainder of the time, and at frequency between approximately 100 Hz and 500 Hz. According to an embodiment of the invention, the duty cycle and frequency used for the first substrate etching process may be different than the duty cycle and frequency used for the second substrate etching process.

According to another embodiment of the invention, the temperature of the chuck supporting the substrate may also be controlled during the first and second substrate etching processes of the embodiment in order to improve the uniformity in the width of the fins across the surface of the substrate. The fins that are proximate to the edge of the substrate typically experience different etch rates than the fins proximate to the center of the substrate. Accordingly, the temperature across the substrate may be varied to account for these differences. According to an embodiment of the invention, the temperature of the chuck supporting the substrate is maintained at a higher temperature proximate to the center of the substrate relative to the temperature of the chuck proximate to the edge of the substrate. According to an embodiment, the temperature of the chuck proximate to the center of the substrate may be maintained at a temperature that is approximately 20° C. greater than the temperature of the chuck proximate to the edge of the substrate. According to an embodiment of the invention, the chuck may be maintained at approximately 30° C. proximate to the center of the substrate, and the chuck may be maintained at approximately 10° C. proximate to the edge of the substrate.

In an additional embodiment of the invention, the uniformity of the fins formed across a substrate are further improved by controlling the plasma density during the first and second substrate etching processes. As used herein, plasma density refers to the density of the ions and radicals present in the plasma. By way of example, a high density plasma would have a greater concentration of ions and radicals per unit area than a low density plasma. In order to account for differences in the etch rates across the surface of the substrate, the plasma density may be varied above different portions of the substrate. The plasma density may be varied by altering the magnetic field of the plasma processing chamber. According to an embodiment of the invention, the plasma density above the center of the substrate may be higher than a plasma density above the edge of the substrate. According to an embodiment of the invention the plasma density may be approximately 5% to 8% higher above the center of the substrate.

Figure 3A:
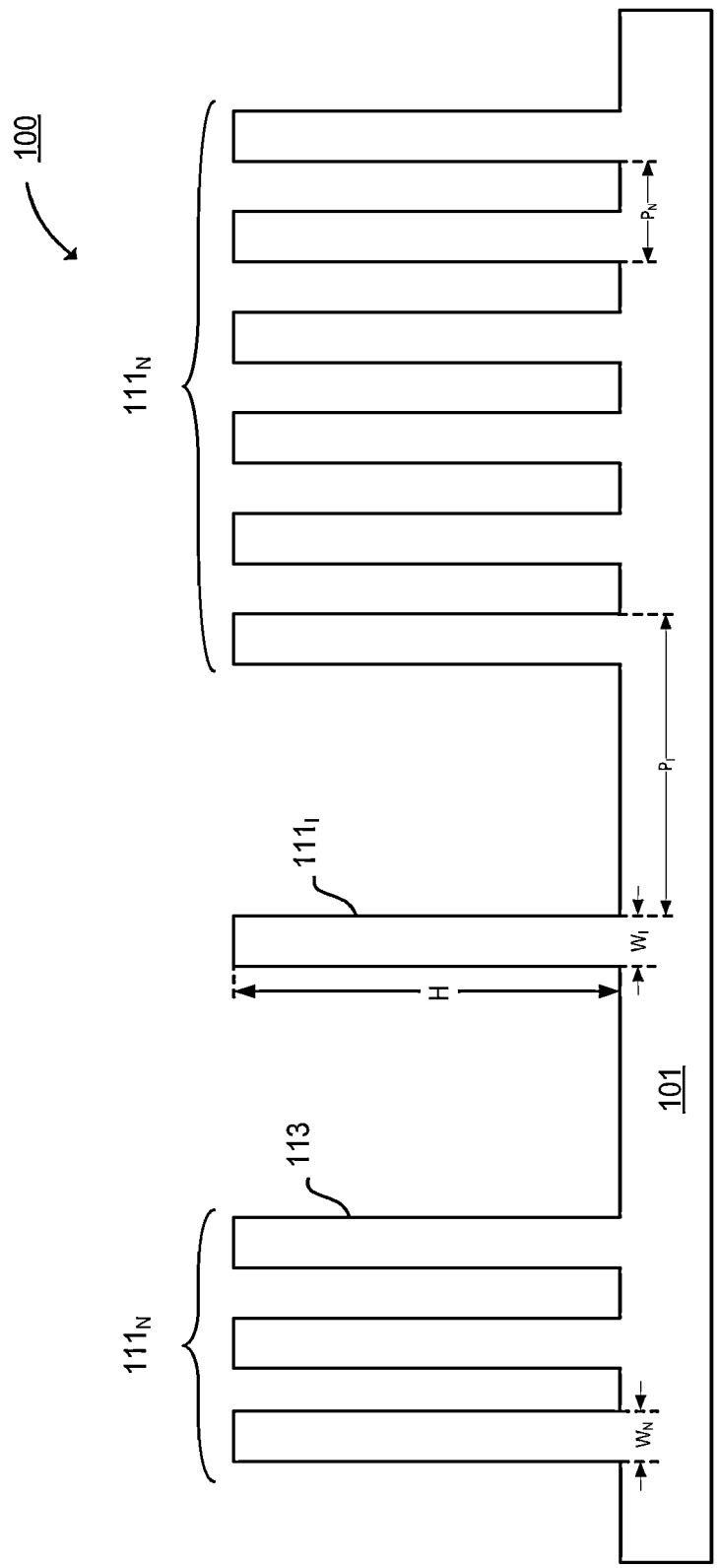
FIG. 3A illustrates a cross-sectional view of a high aspect ratio fin based semiconductor device according to an embodiment of the invention.

Referring now to FIG. 3A, a cross-sectional view of a high aspect ratio fin based semiconductor device 100 formed in accordance with embodiments of the invention is shown. Fin based device 100 includes a plurality of fins 111 formed on a semiconductor substrate 101. According to embodiments of the invention, semiconductor substrate 101 may be composed of a material suitable for semiconductor device fabrication. In an embodiment, the semiconductor substrate 101 is a monocrystalline silicon substrate. In an embodiment, the structure is formed using a bulk semiconductor substrate. Substrate 101 may also be, but is not limited to, germanium, silicon-germanium, or a III-V compound semiconductor material. In another embodiment, the structure is formed using a silicon-on-insulator (SOI) substrate.

Fins 111 are high aspect ratio fins. According to an embodiment, the high aspect ratio fins may have a height to width aspect ratio of 5:1 or greater. According to additional embodiments of the invention, the aspect ratio may be 10:1 or greater. Embodiments of the invention may include fins with heights H that extend 100 nm or more above the substrate 101. Further embodiments of the invention may include fins with heights H that are 150 nm or greater. Additional embodiments of the invention include fin widths W that are less than 25 nm. Embodiments of the invention further include fin widths that are less than 15 nm.

As shown in FIG. 3A, embodiments of the invention include one or more isolated fins 111I and one or more nested fins 111N. According to embodiments of the invention, a nested fin 111N is a fin that has neighboring fins 111 that are formed close enough to have an effect on the etching rate (in the lateral and/or vertical direction) of the nested fin 111N. By way of example, and not by way of limitation, neighboring fins may alter the etch rate of a fin by producing different active ion accessibility at the surface of the substrate during an etching process, or by changing the polymer deposition rate along the sidewalls of the fin. According to an embodiment of the invention, a group of nested fins may have a uniform pitch. Alternatively, a group of nested fins may have a non-uniform pitch, so long as the fins are spaced close enough together to effect the etching rate of neighboring fins. According to embodiments of the invention, an isolated fin 111I is a fin that does not have neighboring fins formed close enough to have an effect on the etching rate of the isolated fin 111I. As shown in the embodiment depicted in FIG. 3A, nested fins are formed with a pitch PN, and the isolated fin is formed with a pitch PI. According to an embodiment of the invention, PI is at least one and a half times as large as PN. By way of example, and not by way of limitation, PN may be approximately 40 nm and PI may be approximately 120 nm. According to embodiments of the invention, the outermost fins of a set of nested fins, such as fin 113 in FIG. 3A, may be considered semi-nested. As such, the sidewall proximate to the nested fins 111N has similar etching characteristics to the nested fins, and the sidewall proximate to the isolated fin 111I has similar etching characteristics to the isolated fins.

According to embodiments of the invention, isolated fins 111I and nested fins 111N are substantially similar to each other, with the exception of their spacing from adjacent fins 111. As such, the heights H of isolated and nested fins may be substantially similar according to an embodiment of the invention. Furthermore, the widths of the isolated fins WI are substantially similar to the widths of the nested fins WN. The uniform shape and width of the isolated and the nested fins 111I, 111N allows for the use of multi-fin devices that have uniform metrics, such as threshold voltage and leakage current. As such, uniform width in nested and isolated fins 111N, 111I allows for the use of isolated fins 111I in circuitry, such as an IC device.

Figure 3B:
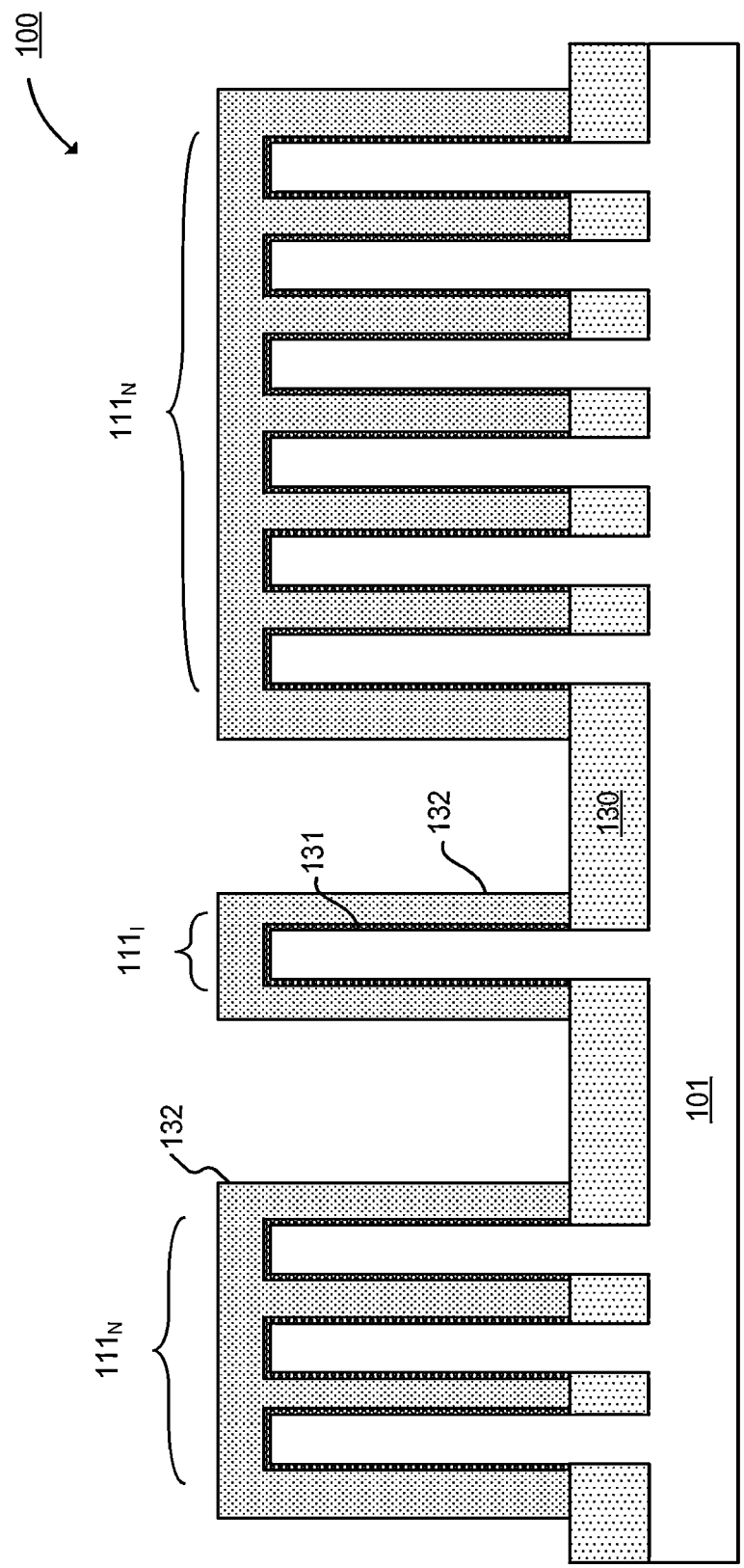
FIG. 3B illustrates a cross-sectional view of a high aspect ratio fin based semiconductor device comprising transistor devices according to an embodiment of the invention.

Referring now to FIG. 3B, an embodiment of the invention including one or more transistor devices formed on the isolated and nested fins 111I and 111N is shown. According to an embodiment of the invention, the transistor devices may include fin-FET devices, such as a tri-gate device, formed on the fins 111. As shown in FIG. 3B, a shallow trench isolation (STI) layer 130 is disposed above the substrate 101 and between the fins 111. According to an embodiment of the invention, the STI layer 130 may be a silicon dioxide, or the like, as is known in the art. A gate dielectric 131 may be disposed over the portions of the fins 111 that extend above the STI layer 130. According to an embodiment, a gate metal 132, may be disposed over each fin 111. As shown in in FIG. 3B, an embodiment of the invention may include a single block of gate metal 132 disposed over the nested fins 111N. The gate metal 132 over the isolated fin 111I is isolated from other gates according to an embodiment of the invention. Therefore, the transistor device formed on the isolated fin 111I can be controlled independent of the nested fins according to an embodiment of the invention. Though not shown in the cross-sectional view of FIG. 3B, those skilled in the art will recognize that source/drain (S/D) regions may be formed in the fins 111 on opposing sides of the gate metal (i.e., into the plane of the page and out of the plane of the page). According to an embodiment, the fins 111 may be suitably doped with n-type and/or p-type dopants in order to form n-MOS and/or P-MOS devices.

Furthermore, those skilled in the art will recognize that high aspect ratio fins described according to embodiments of the present invention are not limited to use with electrical devices and may also be utilized in nanostructures such as those used in nanoelectromechanical systems (NEMS).

Figure 4:
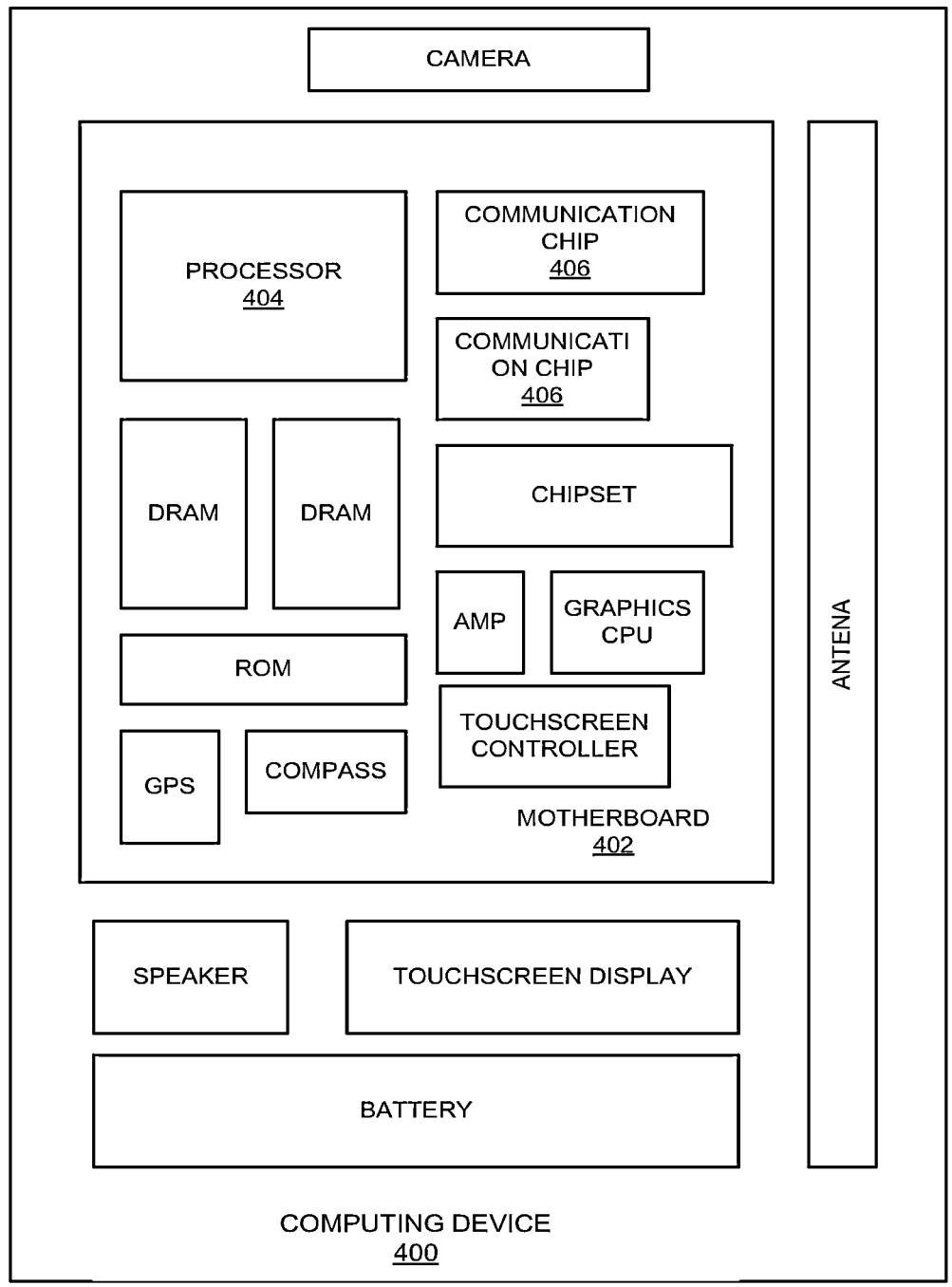
FIG. 4 illustrates a schematic view of a computing device that may utilize a high aspect ratio fin based semiconductor device according to embodiments of the invention.

FIG. 4 illustrates a computing device 400 in accordance with one implementation of the invention. The computing device 400 houses a board 402. The board 402 may include a number of components, including but not limited to a processor 404 and at least one communication chip 406. The processor 404 is physically and electrically coupled to the board 402. In some implementations the at least one communication chip 406 is also physically and electrically coupled to the board 402. In further implementations, the communication chip 406 is part of the processor 404.

Depending on its applications, computing device 400 may include other components that may or may not be physically and electrically coupled to the board 402. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 406 enables wireless communications for the transfer of data to and from the computing device 400. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 406 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 400 may include a plurality of communication chips 406. For instance, a first communication chip 406 may be dedicated to shorter range wireless communications such as Wi-Fi and Bluetooth and a second communication chip 406 may be dedicated to longer range wireless communications such as GPS, EDGE, GPRS, CDMA, WiMAX, LTE, Ev-DO, and others.

The processor 404 of the computing device 400 includes an integrated circuit die packaged within the processor 404. In some implementations of the invention, the integrated circuit die of the processor includes one or more devices, such as MOS-FET transistors formed on high aspect ratio fins formed in accordance with implementations of the invention. The term "processor" may refer to any device or portion of a device that processes electronic data from registers and/or memory to transform that electronic data into other electronic data that may be stored in registers and/or memory.

The communication chip 406 also includes an integrated circuit die packaged within the communication chip 406. In accordance with another implementation of the invention, the integrated circuit die of the communication chip includes one or more devices, such as MOS-FET transistors formed on high aspect ratio fins formed in accordance with implementations of the invention.

In further implementations, another component housed within the computing device 400 may contain an integrated circuit die that includes one or more devices, such as MOS-FET transistors formed on high aspect ratio fins formed in accordance with implementations of the invention.

In various implementations, the computing device 400 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 400 may be any other electronic device that processes data.

An embodiment of the invention includes a method for forming high aspect ratio fins comprising, forming a patterned hard mask with a hard mask etching process, wherein the patterned hard mask comprises one or more isolated features and one or more nested features, etching through a substrate disposed below the patterned hard mask to a first depth with a first substrate etching process, wherein the first substrate etching process transfers the isolated features and the nested features of the patterned hard mask into the substrate to form one or more isolated fins and one or more nested fins, and etching through the substrate to a second depth with a second substrate etching process that is different than the first substrate etching process. An additional embodiment of the invention includes a method wherein a first substrate etch chemistry utilized in the first substrate etching process provides a greater lateral passivation rate for the isolated fins than for the nested fins, and wherein a second substrate etch chemistry utilized in the second substrate etching process provides a greater lateral etch rate for the isolated fins than for the nested fins. An additional embodiment of the invention includes a method wherein the first etch chemistry comprises HBr, O2 and CF4. An additional embodiment of the invention includes a method wherein the second etch chemistry comprises Cl2, Ar, and CH4. An additional embodiment of the invention includes a method wherein the hard mask etching process further utilizes a chemistry comprising a greater concentration of hydrogen than a concentration of oxygen. An additional embodiment of the invention includes a method wherein the chemistry utilized for the hard mask etching process comprises a hydrogen to oxygen ratio between approximately 2.5:1 and 3.5:1. An additional embodiment of the invention includes a method wherein the hard mask etching process utilizes a chemistry comprising CH3F. An additional embodiment of the invention includes a method further comprising varying a flow rate of the gases used in the hard mask etching process across the surface of the hard mask layer, wherein the flow rate of the gases used in the hard mask etching process is lower proximate to an edge of the hard mask layer relative to the flow rate of the gases used in the hard mask etching process proximate the center of the hard mask layer. An additional embodiment of the invention includes a method wherein the hard mask etching process further comprises maintaining a total pressure inside a processing chamber between 24 mTorr and 28 mTorr. An additional embodiment of the invention includes a method wherein the first depth is between 70 nm and 100 nm. An additional embodiment of the invention includes a method wherein the second depth is between 130 nm and 170 nm. An additional embodiment of the invention includes a method wherein the hard mask etching process further comprises maintaining a chuck that supports the semiconductor substrate at a temperature between 35° C. and 40° C. during the hard mask etching process. An additional embodiment of the invention includes a method wherein the first and second substrate etching processes further comprise, maintaining a chuck that supports the semiconductor substrate at a variable temperature across the substrate, wherein a temperature of the chuck proximate to the center of the semiconductor substrate is higher than a temperature of the chuck proximate to the edge of the semiconductor substrate. An additional embodiment of the invention includes a method wherein the temperature of the chuck proximate to the center of the semiconductor substrate is maintained at 30° C. and the temperature of the chuck proximate to the edge of the semiconductor substrate is maintained at 10° C. An additional embodiment of the invention includes a method wherein the first and second substrate etching processes further comprise, pulsing an RF power source. An additional embodiment of the invention includes a method wherein pulsing the RF power source comprises pulsing the RF power with a duty cycle that is on for 10% of the time and off for 90% of the time. An additional embodiment of the invention includes a method wherein the first and second substrate etching processes further comprise controlling a plasma density across the surface of the substrate such that a plasma density proximate to an edge of the substrate is lower than a plasma density proximate to the center of the substrate. An additional embodiment of the invention includes a method wherein forming the patterned hard mask comprises a multiple patterning process.

An embodiment of the invention includes a method for forming high aspect ratio fins comprising forming a dummy hard mask over a hard mask layer, wherein the dummy hard mask defines a plurality of features having one or more isolated features and one or more nested features, wherein the hard mask layer is disposed above an etch stop layer, and wherein the etch stop layer is disposed above a semiconductor substrate, performing a hard mask etching process to etch through the hard mask layer, wherein the nested and isolated features in the dummy hard mask are transferred into the hard mask layer, performing a break through etching process to etch through the etch stop layer, etching through the substrate to a first depth with a first substrate etching process, and etching through the substrate to a second depth with a second substrate etching process that is different from the first substrate etching process. An additional embodiment of the invention includes a method wherein the first substrate etching process utilizes a chemistry comprising HBr, O2 and CF4 and wherein the second substrate etching process utilizes a chemistry comprising Cl2, Ar, and CH4. An additional embodiment of the invention includes a method wherein a first substrate etch chemistry utilized in the first substrate etching process provides a greater lateral passivation rate for the isolated fins than for the nested fins, and wherein a second substrate etch chemistry utilized in the second substrate etching process provides a greater lateral etch rate for the isolated fins than for the nested fins.

An embodiment of the invention includes a semiconductor device comprising, one or more nested high aspect ratio features having a first width, and one or more isolated high aspect ratio features having a second width, wherein the second width is equal to the first width. An additional embodiment of the invention includes a semiconductor device wherein the aspect ratio of the isolated and nested fins is greater than 10:1. An additional embodiment of the invention includes a semiconductor device wherein the nested fins have a pitch of 42 nm or less. An additional embodiment of the invention includes a semiconductor device wherein the first width and second width are less than 15 nm.

Reference throughout this disclosure to "one embodiment" or "an embodiment" means that a particular feature, structure, or characteristic described in connection with the embodiment is included in at least one embodiment of the present invention. The appearance of the phrases "in one embodiment" or "in an embodiment" in various places throughout this disclosure are not necessarily all referring to the same embodiment. Furthermore, the particular features, structures, or characteristics may be combined in any suitable manner in one or more embodiments.

In the foregoing Detailed Description, various features are grouped together in a single embodiment for the purpose of streamlining the disclosure. This method of disclosure is not to be interpreted as reflecting an intention that the claimed embodiments of the invention require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separate embodiment.

It will be readily understood to those skilled in the art that various other changes in the details, material, and arrangements of the parts and method stages which have been described and illustrated in order to explain the nature of this invention may be made without departing from the principles and scope of the invention as expressed in the subjoined claims.

What is claimed is:

1. A semiconductor structure, comprising:
   a substrate;
   a first nested grouping of three-dimensional semiconductor bodies above the substrate, the first nested grouping of three-dimensional semiconductor bodies comprising:
      a first three-dimensional semiconductor body having a top and laterally opposite sidewalls; and
      a second three-dimensional semiconductor body having a top and laterally opposite sidewalls, wherein the second three-dimensional semiconductor body is laterally directly adjacent the first three-dimensional semiconductor body at a first spacing;
   a second nested grouping of three-dimensional semiconductor bodies extending from the substrate, the second nested grouping of three-dimensional semiconductor bodies comprising:
      a third three-dimensional semiconductor body having a top and laterally opposite sidewalls;
      a fourth three-dimensional semiconductor body having a top and laterally opposite sidewalls, wherein the fourth three-dimensional semiconductor body is laterally directly adjacent the third three-dimensional semiconductor body at the first spacing; and
      a fifth three-dimensional semiconductor body having a top and laterally opposite sidewalls, wherein the fifth three-dimensional semiconductor body is laterally directly adjacent the fourth three-dimensional semiconductor body at the first spacing; and
   an isolated three-dimensional semiconductor body extending from the substrate, the isolated three-dimensional semiconductor body having a top and laterally opposite sidewalls, the isolated three-dimensional semiconductor body laterally directly adjacent the first three-dimensional semiconductor body at a second spacing greater than the first spacing, and the isolated three-dimensional semiconductor body laterally directly adjacent the third three-dimensional semiconductor body at the second spacing.

2. The semiconductor structure of claim 1, wherein the first three-dimensional semiconductor body, the second three-dimensional semiconductor body, the third three-dimensional semiconductor body, the fourth three-dimensional semiconductor body and the isolated three-dimensional semiconductor body all have a same height to width aspect ratio.

3. The semiconductor structure of claim 1, wherein the second spacing is greater than 1.5 times the first spacing.

4. The semiconductor structure of claim 1, wherein the first spacing is 42 nm or less.

5. The semiconductor structure of claim 1, wherein the first three-dimensional semiconductor body, the second three-dimensional semiconductor body, the third three-dimensional semiconductor body, the fourth three-dimensional semiconductor body and the isolated three-dimensional semiconductor body all have a height of 150 nm or greater.

6. The semiconductor structure of claim 1, wherein the first three-dimensional semiconductor body, the second three-dimensional semiconductor body, the third three-dimensional semiconductor body, the fourth three-dimensional semiconductor body and the isolated three-dimensional semiconductor body all have a shape of the three-dimensional semiconductor bodies is substantially rectangular.

7. The semiconductor structure of claim 1, wherein a number of three-dimensional semiconductor bodies in the second nested grouping of three-dimensional semiconductor bodies is different than a number of three-dimensional semiconductor bodies in the first nested grouping of three-dimensional semiconductor bodies.

8. The semiconductor structure of claim 1, wherein a number of three-dimensional semiconductor bodies in the second nested grouping of three-dimensional semiconductor bodies is equal to a number of three-dimensional semiconductor bodies in the first nested grouping of three-dimensional semiconductor bodies.

9. The semiconductor structure of claim 1, further comprising:
a dielectric layer over at least top and laterally opposite sidewalls of the first three-dimensional semiconductor body, the second three-dimensional semiconductor body, the third three-dimensional semiconductor body, the fourth three-dimensional semiconductor body, and the isolated three-dimensional semiconductor body.

10. The semiconductor structure of claim 9, further comprising:
a first gate metal over at least the top and laterally opposite sidewalls of the first three-dimensional semiconductor body and the second three-dimensional semiconductor body;
a second gate metal over at least the top and laterally opposite sidewalls of the isolated three-dimensional semiconductor body; and
a third gate metal over at least the top and laterally opposite sidewalls of the third three-dimensional semiconductor body and the fourth three-dimensional semiconductor body.

11. The semiconductor structure of claim 10, wherein the first gate metal is electrically isolated from the second gate metal, and the second gate metal is electrically isolated from the third gate metal.

12. A computing device, comprising:
a board; and
a processor electrically and physically coupled to the board, wherein the processor comprises:
a substrate;
a first nested grouping of three-dimensional semiconductor bodies above the substrate, the first nested grouping of three-dimensional semiconductor bodies comprising:
a first three-dimensional semiconductor body having a top and laterally opposite sidewalls; and
a second three-dimensional semiconductor body having a top and laterally opposite sidewalls, wherein the second three-dimensional semiconductor body is laterally directly adjacent the first three-dimensional semiconductor body at a first spacing;
a second nested grouping of three-dimensional semiconductor bodies extending from the substrate, the second nested grouping of three-dimensional semiconductor bodies comprising:
a third three-dimensional semiconductor body having a top and laterally opposite sidewalls;
a fourth three-dimensional semiconductor body having a top and laterally opposite sidewalls, wherein the fourth three-dimensional semiconductor body is laterally directly adjacent the third three-dimensional semiconductor body at the first spacing; and
a fifth three-dimensional semiconductor body having a top and laterally opposite sidewalls, wherein the fifth three-dimensional semiconductor body is laterally directly adjacent the fourth three-dimensional semiconductor body at the first spacing; and
an isolated three-dimensional semiconductor body extending from the substrate, the isolated three-dimensional semiconductor body having a top and laterally opposite sidewalls, the isolated three-dimensional semiconductor body laterally directly adjacent the first three-dimensional semiconductor body at a second spacing greater than the first spacing, and the isolated three-dimensional semiconductor body laterally directly adjacent the third three-dimensional semiconductor body at the second spacing.

13. The computing device of claim 12, further comprising:
a memory coupled to the board.

14. The computing device of claim 12, further comprising:
a communication chip coupled to the board.

15. The computing device of claim 12, further comprising:
a DRAM coupled to the board.

16. The computing device of claim 12, further comprising:
a compass coupled to the board.

17. The computing device of claim 12, further comprising:
a GPS coupled to the board.

18. The computing device of claim 12, further comprising:
a speaker coupled to the board.

19. The computing device of claim 12, further comprising:
a display coupled to the board.

20. The computing device of claim 12, further comprising:
a battery coupled to the board.

* * * * *